United States Patent
Watarai

(10) Patent No.: US 6,886,144 B2
(45) Date of Patent: Apr. 26, 2005

(54) LOGIC VERIFICATION METHOD FOR SEMICONDUCTOR DEVICE

(75) Inventor: Yuji Watarai, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 281 days.

(21) Appl. No.: 10/353,003

(22) Filed: Jan. 29, 2003

(65) Prior Publication Data

US 2003/0226125 A1 Dec. 4, 2003

(30) Foreign Application Priority Data

May 29, 2002 (JP) ....................................... 2002-155654

(51) Int. Cl.[7] ............................................. G06F 17/50
(52) U.S. Cl. ...................... 716/5; 716/7; 716/3; 703/16
(58) Field of Search ........................ 716/5, 7, 3; 703/16

(56) References Cited

U.S. PATENT DOCUMENTS

| | | | | |
|---|---|---|---|---|
| 4,758,953 | A | * | 7/1988 | Morita et al. ................... 716/1 |
| 5,473,546 | A | * | 12/1995 | Filseth .......................... 716/8 |
| 6,493,864 | B1 | * | 12/2002 | Liu ............................... 716/18 |
| 2002/0023256 | A1 | * | 2/2002 | Seawright .................... 716/18 |
| 2003/0131327 | A1 | * | 7/2003 | Dervisoglu et al. ............ 716/4 |
| 2003/0163795 | A1 | * | 8/2003 | Morgan et al. ................ 716/10 |
| 2004/0078767 | A1 | * | 4/2004 | Burks et al. ................... 716/8 |

FOREIGN PATENT DOCUMENTS

| | | | | |
|---|---|---|---|---|
| JP | 02025980 A | * | 1/1990 | ........... G06F/15/60 |
| JP | 02037474 A | * | 2/1990 | ........... G06F/15/60 |

OTHER PUBLICATIONS

Chen et al., "Model aggregation for hierarchical control synthesis of discrete event systems", Proceedings of the 39th IEEE Conference on Decision and Control, vol. 1, pp. 418–423, Dec. 12, 2000.*

* cited by examiner

Primary Examiner—Vuthe Siek
Assistant Examiner—Phallaka Kik
(74) Attorney, Agent, or Firm—Staas & Halsey LLP

(57) ABSTRACT

In designing a semiconductor device, a method of verifying an upper-hierarchy logic including a lower-hierarchy logic. First, a first verification logic having an output terminal, which is equivalent to an input terminal of the lower-hierarchy logic, and an input terminal, which is equivalent to an output terminal of the lower-hierarchy logic. Then, a second verification logic including only the input terminal and output terminal of the lower-hierarchy logic is produced, and an operational verification of the upper-hierarchy logic is executed using the first and second verification logics. This method eliminates the need for performing an operational verification of the lower-hierarchy logic at the time of the operational verification of the upper-hierarchy logic.

16 Claims, 6 Drawing Sheets

I # LOGIC VERIFICATION METHOD FOR SEMICONDUCTOR DEVICE

CROSS-REFERENCE TO RELATED APPLICATIONS

This application is based upon and claims the benefit of priority from the prior Japanese Patent Application No. 2002-155654, filed on May 29, 2002, the entire contents of which are incorporated herein by reference.

BACKGROUND OF THE INVENTION

The present invention relates to a logic verification method for semiconductor devices, and, more particularly, to a logic verification method for semiconductor devices which have logics described hierarchically.

In designing semiconductor devices, such as Large Scale Integration (LSI), the operation of logic-described circuits is verified by logic simulation. In general, the logics of an LSI are described hierarchically by a hardware description language (HDL). The recent trend is toward production of system LSIs that achieve system level functions on a single chip. In a system LSI, logics are described for each of various functional macros, and logics, which show the connection relationship among the functional macros.

Logic verification of an LSI is executed using a logic simulator. The logic simulator provides LSI logics with various kinds of input signal values and compare output signal values corresponding to the input signal values with expected values for normal logic operations of the LSI to check if they match one another.

At the time of verifying the LSI logics, it is necessary to produce logics described hierarchically beforehand. Specifically, in a case where there is a lower-hierarchy logic to be logically combined (connected) with an upper-hierarchy logic to be verified, the upper-hierarchy logic and lower-hierarchy logic descriptions are needed. Even if an upper-hierarchy logic (interconnection logic among individual functional macros) is to be verified, for example, verification cannot be done unless without all of the lower-hierarchy logics. In a case where any lower-hierarchy logic has not been produced, which is associated with logic to be verified, it is necessary to prepare a pseudo operational model for that lower-hierarchy logic.

As mentioned above, verification of upper-hierarchy logic involves lower-hierarchy logics which are not the verification target. This makes the verification time (logic simulation execution time) longer. Since a logic simulator stores lower-hierarchy logics in a memory, the amount of memory occupation increases at the time of logic verification. This slows down the logic verification execution, thus resulting in a lower efficiency of logic verification. Further, in the case of verifying logics including a lower-hierarchy logic which is not the verification target, input signal values, which are combinations of various signals, should be generated in order to acquire arbitrary output signal values from that lower-hierarchy logic. This further reduces the efficiency of logic verification.

SUMMARY OF THE INVENTION

In a first aspect of the present invention, a method is provided that verifies an upper-hierarchy logic including at least one lower-hierarchy logic, which includes a lower-hierarchy input terminal and a lower-hierarchy output terminal in designing a semiconductor device. The method includes producing a first verification logic having a first output terminal, which is equivalent to the lower-hierarchy input terminal of the lower-hierarchy logic, and a first input terminal, which is equivalent to the lower-hierarchy output terminal of the lower-hierarchy logic; producing a second verification logic including only the lower-hierarchy input terminal and the lower-hierarchy output terminal of the lower-hierarchy logic; and executing an operational verification of the upper-hierarchy logic using the first and second verification logics.

In a second aspect of the present invention, a method is provided that verifies an upper-hierarchy logic including at least one lower-hierarchy logic, which includes a lower-hierarchy input terminal and a lower-hierarchy output terminal in designing a semiconductor device. The method includes deleting a logic excluding the lower-hierarchy input terminal and the lower-hierarchy output terminal from the lower-hierarchy logic; producing a verification logic by adding a first output terminal, which is equivalent to the lower-hierarchy input terminal, and a first input terminal, which is equivalent to the lower-hierarchy output terminal, to the lower-hierarchy logic having undergone that the step of deleting; and executing an operational verification of the upper-hierarchy logic using the verification logic.

In a third aspect of the present invention, a computer readable program for verifying an upper-hierarchy logic including at least one lower-hierarchy logic, which includes a lower-hierarchy input terminal and a lower-hierarchy output terminal in designing a semiconductor device is provided. The program causes the computer to execute the method including producing a first verification logic having a first output terminal, which is equivalent to the lower-hierarchy input terminal of the lower-hierarchy logic, and a first input terminal, which is equivalent to the lower-hierarchy output terminal of the lower-hierarchy logic; producing a second verification logic including only the lower-hierarchy input terminal and the lower-hierarchy output terminal of the lower-hierarchy logic; and executing an operational verification of the upper-hierarchy logic using the first and second verification logics.

In a fourth aspect of the present invention, a computer readable program for verifying an upper-hierarchy logic including at least one lower-hierarchy logic, which includes a lower-hierarchy input terminal and a lower-hierarchy output terminal in designing a semiconductor device is provided. The program causes the computer to execute the method including deleting a logic excluding the lower-hierarchy input terminal and the lower-hierarchy output terminal from the lower-hierarchy logic; producing a verification logic by adding a first output terminal, which is equivalent to the lower-hierarchy input terminal, and a first input terminal, which is equivalent to the lower-hierarchy output terminal, to the lower-hierarchy logic having undergone the step of deleting; and executing an operational verification of the upper-hierarchy logic using the verification logic.

In a fifth aspect of the present invention, an apparatus for verifying an upper-hierarchy logic including at least one lower-hierarchy logic, which includes a lower-hierarchy input terminal and a lower-hierarchy output terminal is provided. The apparatus includes a processing unit for producing a first verification logic having a first output terminal, which is equivalent to the lower-hierarchy input terminal of the lower-hierarchy logic, and a first input terminal, which is equivalent to the lower-hierarchy output terminal of the lower-hierarchy logic. The processing unit produces a second verification logic including only the lower-hierarchy input terminal and the lower-hierarchy output terminal of the lower-hierarchy logic. A memory is coupled to the processing unit to store the first and second verification logics. The processing unit executes an operational verification of the upper-hierarchy logic using the first and second verification logics stored in the memory.

In a sixth aspect of the present invention, an apparatus for verifying an upper-hierarchy logic including at least one lower-hierarchy logic, which includes a lower-hierarchy input terminal and a lower-hierarchy output terminal is provided. The apparatus includes a processing unit for deleting a logic excluding the lower-hierarchy input terminal and the lower-hierarchy output terminal from the lower-hierarchy logic. The processing unit produces a verification logic by adding a first output terminal, which is equivalent to the lower-hierarchy input terminal, and a first input terminal, which is equivalent to the lower-hierarchy output terminal, to the lower-hierarchy logic having undergone the deleting. A memory is coupled to the processing unit to store the verification logic. The processing unit executes an operational verification of the upper-hierarchy logic using the verification logic stored in the memory.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
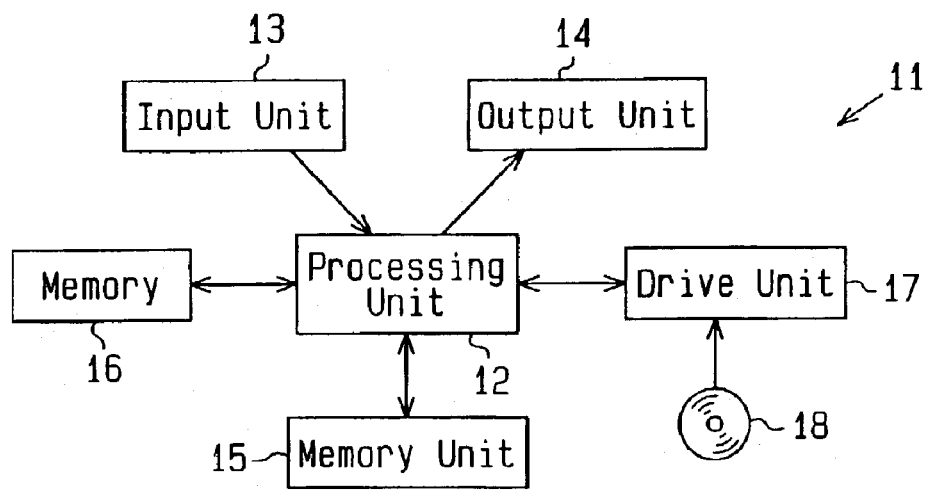
FIG. 1 is a schematic block diagram of a logic simulator which executes a logic verification method according to the present invention.

In the drawings, like numerals are used for like elements throughout.

The following will describe a logic verification method for a semiconductor device (LSI) according to a first embodiment of the present invention using a logic simulator 11. As shown in FIG. 1, the logic simulator 11 includes a processing unit 12, an input unit 13, an output unit 14, a memory unit 15, a memory 16 and a drive unit 17, with the last five components being connected to the processing unit 12.

The input unit 13 includes a keyboard and a mouse device which are used by a user to make requests and commands for activation of a program, inputting of parameters and so forth. The output unit 14 includes a display device (not shown), such as a cathode ray tube (CRT), a liquid crystal display (LCD) or a plasma display panel (PDP), and an output device (not shown), such as a printer, and which are used to display circuit diagrams, a data input screen, etc.

Available as the memory unit 15 is a magnetic disk unit, an optical disk unit or a magneto-optical disk unit (none shown), and stores a logic verification program, logic macro data and input/output data as a test bench.

Logic macros, which are obtained by logic description of various functional macros included in an LSI by, for example, hardware description language (HDL), are stored in the logic macro data area of the memory unit 15 as a net list. Stored in the input/output data area of the memory unit 15 are input signal values, which are supplied to individual logic macros at the time of executing logic verification, and output signal values (expected values) corresponding to the input signal values. The logic verification program is used by the logic simulator 11 to execute logic simulation.

The processing unit 12 performs logic simulation in accordance with the logic verification program. Specifically, the processing unit 12 reads logic macro data and input/output data from the memory unit 15, stores that data in the memory 16 and executes a logic verification process using the data in the memory 16. The memory 16 includes a cache memory, a system memory and a display memory.

The drive unit 17 drives a recording medium 18 and accesses data recorded on the recording medium 18. Any computer readable recording medium, such as magnetic tape (MT), a memory card, an optical disk (CD-ROM, DVD-ROM or the like) or a magneto-optical disk (MO, MD or the like), none of which are shown, can be used as the recording medium 18. Logic macro data and input/output data may be recorded on the recording medium 18 and logic macro data and input/output data may be loaded into the memory 16 from the recording medium 18.

A logic verification method according to the first embodiment will be discussed below referring to FIGS. 2 to 5.

Figure 2:
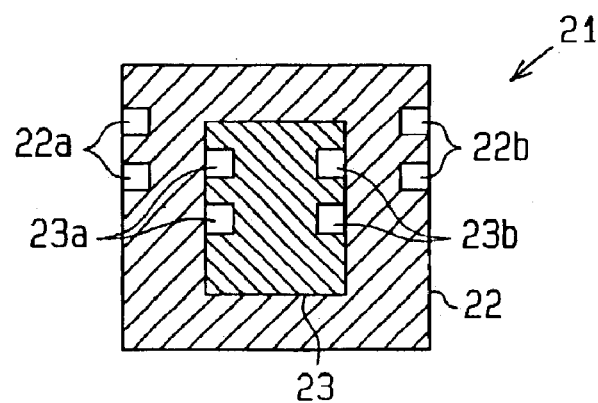
FIG. 2 shows the logic structure of a system LSI.

As shown in FIG. 2, a system LSI 21 comprises, for example, a logic macro 22 of an upper-hierarchy (hereinafter called "upper-hierarchy logic") and a logic macro 23 of a lower-hierarchy (hereinafter called "lower-hierarchy logic). In this embodiment, the upper-hierarchy logic 22 is logic data of the uppermost hierarchy in which the chip level of the system LSI 21 is described. The lower-hierarchy logic 23 is logic data which is logically combined (connected) with the upper-hierarchy logic 22. The upper-hierarchy logic 22 includes logic data which describes input terminals 22a and output terminals 22b (two each in FIG. 2), a description for invoking the lower-hierarchy logic 23 and a description of connection for the lower-hierarchy logic 23. The lower-hierarchy logic 23 includes logic data which describes input terminals 23a and output terminals 23b.

A description will now be given of a verification method (logic simulation) for the upper-hierarchy logic 22 of the system LSI 21.

Figure 3:
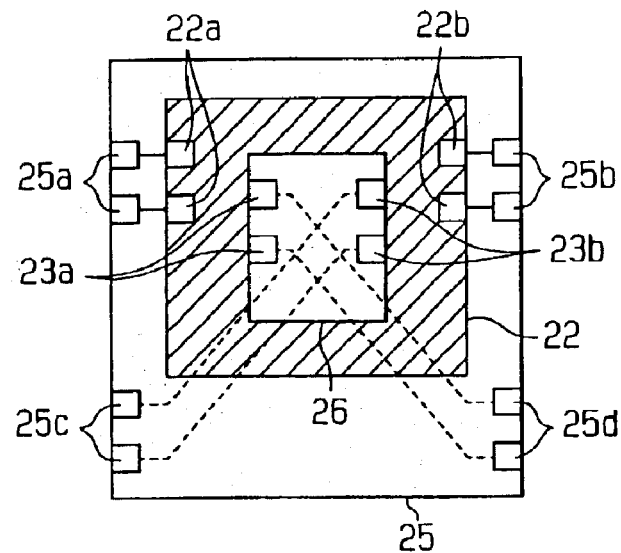
FIG. 3 shows a logic structure in a logic verification method according to a first embodiment of the present invention.

FIG. 3 shows a logic structure (net list) at the time logic simulation is executed. As shown in FIG. 3, the logic simulator 11 produces first and second verification logics 25 and 26 describing logic data for input/output terminals, which show the connection relationship between the upper-hierarchy logic 22 to be verified and the lower-hierarchy logic 23.

The first verification logic 25 is logic data for a higher hierarchy which includes the upper-hierarchy logic 22 to be verified. The first verification logic 25 includes logic data which describes input terminals 25a equivalent to the input terminals 22a of the upper-hierarchy logic 22, output terminals 25b equivalent to the output terminals 22b of the upper-hierarchy logic 22, input terminals 25c equivalent to the output terminals 23b of the lower-hierarchy logic 23 and output terminals 25d equivalent to the input terminals 23a of the lower-hierarchy logic 23. Equivalent terminals are described by the same logic data such that a signal value which is input to or output from one terminal becomes substantially identical to a signal value which is input to or output from a terminal equivalent to the former terminal. For example, signal values, which are substantially identical to signal values input to the input terminals 23a, are output from the output terminals 25d which are equivalent to the input terminals 23a. Further, signal values, which are substantially identical to signal values output from the output terminals 23b, are supplied to the input terminals 25c which are equivalent to the output terminals 23b.

The second verification logic 26 is logic data which describes only those terminals that are connected to the upper-hierarchy logic 22. That is, the second verification logic 26 includes descriptions of the input terminals 23a and output terminals 23b of the lower-hierarchy logic 23 and does not include descriptions of those logics which exclude the input terminals 23a and output terminals 23b. Therefore, in the simulation of the upper-hierarchy logic 22 using the first and second verification logics 25 and 26, output signal values according to the input signal values to the input terminals 25a are input to the input terminals 23a of the lower-hierarchy logic 23, and output signal values, which are substantially identical to those output signal values, are output from the output terminals 25d. Input signal values, which are substantially identical to those of the output signal values from the output terminals 23b of the lower-hierarchy logic 23, are input to the input terminals 25c, and output signal values according to the input signal values are output from the output terminals 25b.

Figure 4:
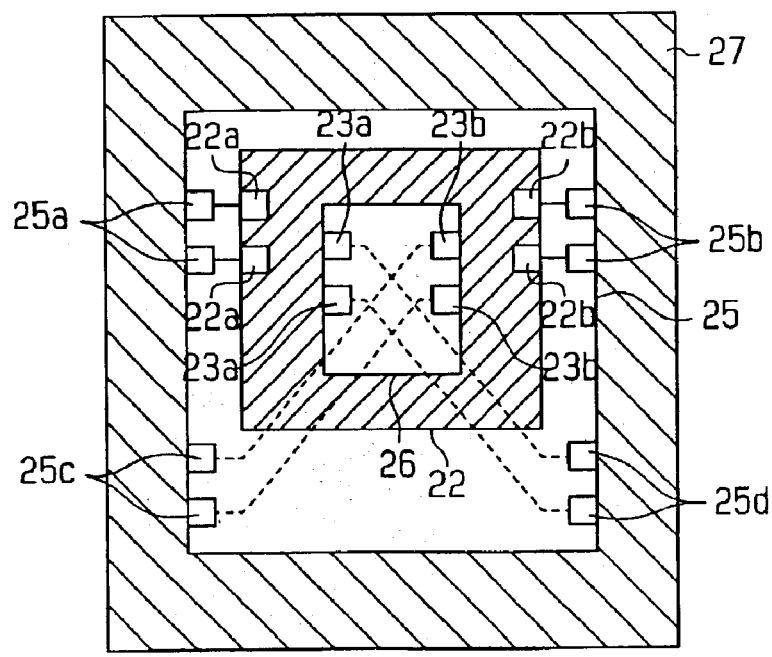
FIG. 4 is a conceptual diagram of logic simulation using the logic structure of FIG. 3.

As shown in FIG. 4, the logic simulator 11 produces the first and second verification logics 25 and 26 and executes logic simulation of the upper-hierarchy logic 22 using the first and second verification logics 25 and 26 and a test bench 27 which describes test pattern data. Described in the test bench 27 is input/output data of input signal values supplied to the system LSI 21 from an external device and expected values which are output from the system LSI 21.

Figure 5:
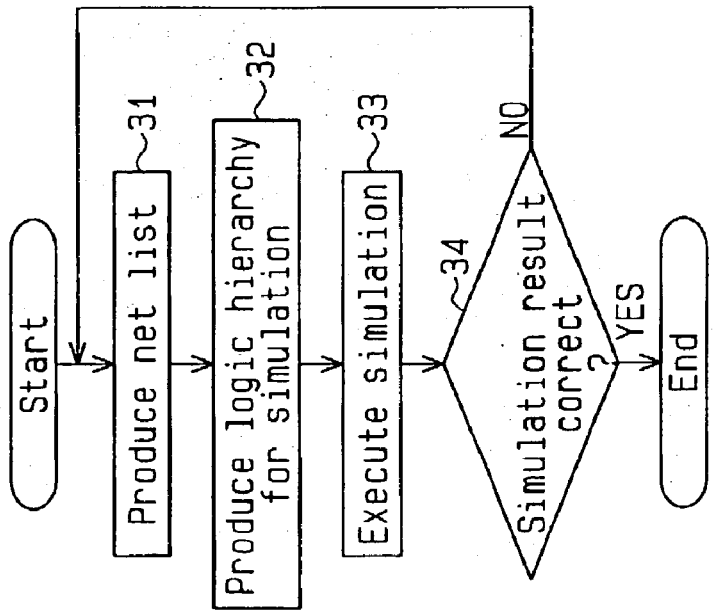
FIG. 5 is a flowchart illustrating a logic verification process for an upper-hierarchy logic by the logic verification method according to the first embodiment of the present invention.

A process for logic verification of an upper-hierarchy logic (simulation of the upper-hierarchy logic 22) by the logic simulator 11 will be discussed below in accordance with the flowchart in FIG. 5.

First, the logic simulator 11 generates the net list of a logic to be verified by the system LSI 21 (step 31). That is, the logic simulator 11 reads logic data for the upper-hierarchy logic 22 to be verified from the memory unit 15 and stores the logic data into the memory 16.

Then, the logic simulator 11 produces the first and second verification logics 25 and 26, which are logic hierarchies for verification with respect to the upper-hierarchy logic 22 to be verified and stores the first and second verification logics 25 and 26 into the memory 16 (step 32).

Subsequently, the logic simulator 11 executes simulation of the upper-hierarchy logic 22 using the test bench 27 (step 33) and determines whether the logic operation of the upper-hierarchy logic 22 is normal or not based on the results of the simulation (step 34). Specifically, the logic simulator 11 supplies input signal values to the input terminals 25a of the first verification logic 25 via the test bench 27 and determines whether or not output signal values, which are output from the output terminals 25d of the first verification logic 25 according to the input signal values, are substantially the same as the expected values. Further, the logic simulator 11 supplies the input signal values to the input terminals 25c and determines whether or not output signal values, which are output from the output terminals 25b of the first verification logic 25 according to the input signal values, are substantially the same as the expected values. When the simulation results do not match, the logic simulator 11 executes steps 31 to 33 again to repeat the logic simulation.

Figure 6:
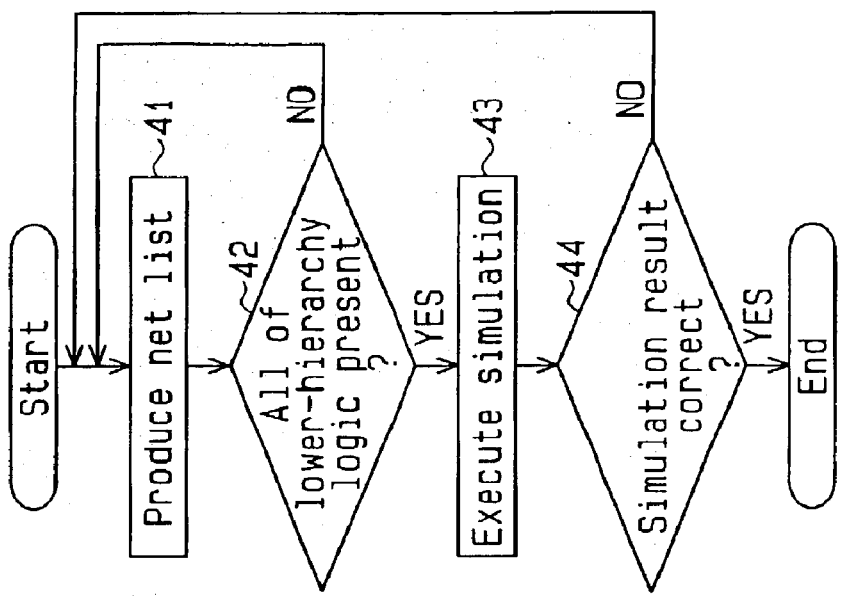
FIG. 6 is a flowchart illustrating a conventional logic verification process for an upper-hierarchy logic.

FIG. 6 is a flowchart illustrating a logic simulation process for an upper-hierarchy logic according to the conventional logic verification process. For the sake of descriptive convenience, the upper-hierarchy logic 22 is verified using the logics of the system LSI 21 of FIG. 2.

First, the logic simulator generates the logic net list of the system LSI 21. Specifically, in the system LSI 21, the logic simulator reads the upper-hierarchy logic to be verified and all the lower-hierarchy logics included in that upper-hierarchy logic from the memory unit and stores the logics into the memory (step 41). Subsequently, the logic simulator determines whether or not all of the lower-hierarchy logics associated with the upper-hierarchy logic to be verified, are present (step 42). In a case where all of the lower-hierarchy logics are present, the logic simulator executes simulation (step 43) and determines, based on the simulation results, whether the logic operation is normal or not (step 44).

The conventional verification method requires all of the lower-hierarchy logics with respect to the upper-hierarchy logic to be verified and, if there is not a lower-hierarchy logic, requires an operational model in which that logic is replaced with pseudo logic. Storing all of the lower-hierarchy logics, which are not the verification target, or all of the logics of the operational model increases the amount of space occupied in the memory and slows down the execution of the logic simulator. As logic verification is also performed on the lower-hierarchy logics, which are not the verification target, the logic verification time becomes longer.

Figure 7:
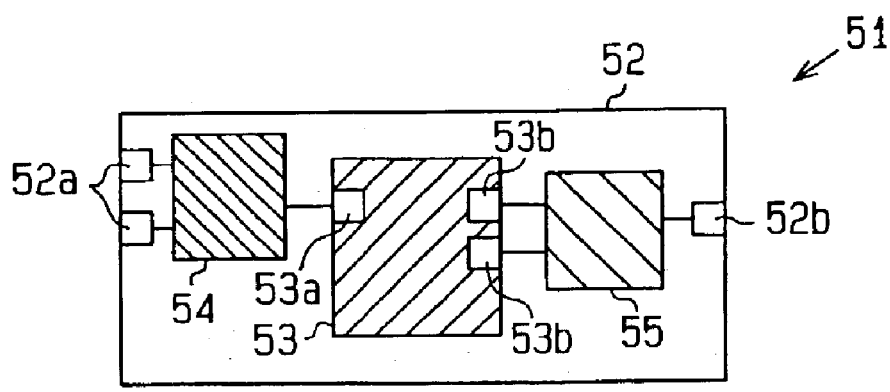
FIG. 7 shows the logic structure of another system LSI.
Figure 8:
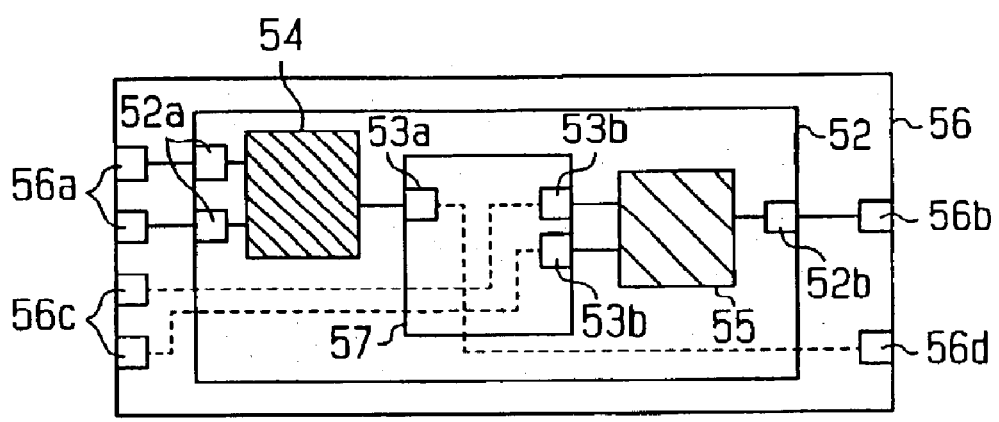
FIG. 8 shows the logic structure of an upper-hierarchy logic of the system LSI of FIG. 7 in the logic verification method of the present invention.
Figure 9:
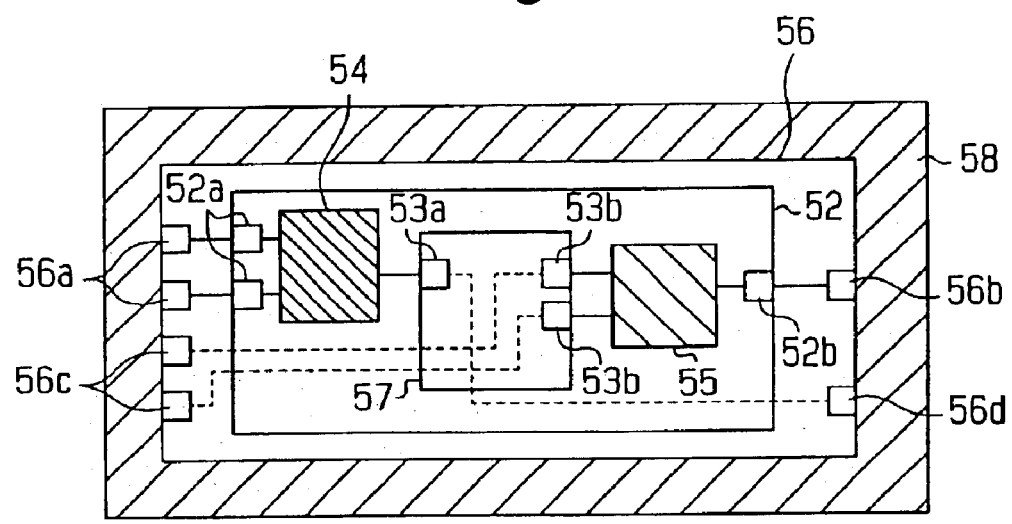
FIG. 9 is a conceptual diagram of logic simulation using the logic structure of FIG. 8.

FIGS. 7 to 9 exemplify the logic verification method of another system LSI 51. The system LSI 51 shown in FIG. 7 includes a logic 52 (upper-hierarchy logic) and a logic 53 (lower-hierarchy logic) which is logic data for the lower-hierarchy logic to the logic 52.

The logic 52 includes logics 54 and 55, which are logic data for the same hierarchy. Therefore, the logic 53 is logic data for lower-hierarchy logic with respect to each logic 54 or 55. The upper-hierarchy logic 52 includes logic data for input terminals 52a and output terminals 52b. The lower-hierarchy logic 53 includes logic data for input terminals 53a and output terminals 53b.

In the case of verifying the upper-hierarchy logic 52 (logics 54 and 55) for the system LSI 51, first and second verification logics 56 and 57 are produced as shown in FIG. 8.

The first verification logic 56 is produced as logic data for a higher hierarchy including the upper-hierarchy logic 52 to be verified, and includes logic data, which describes input terminals 56a equivalent to the input terminals 52a of the upper-hierarchy logic 52, and logic data which describes output terminals 56b equivalent to the output terminals 52b of the upper-hierarchy logic 52. The first verification logic 56 further includes logic data, which describes input terminals 56c equivalent to the output terminals 53b of the lower-hierarchy logic 53, and logic data which describes output terminals 56d equivalent to the input terminals 53a of the lower-hierarchy logic 53.

The second verification logic 57 includes logic data which describes only the input terminals 53a and output terminals 53b of the lower-hierarchy logic 53. In other words, the second verification logic 57 does not include those logics which exclude the input terminals 53a and the output terminals 53b.

As shown in FIG. 9, the logic simulator 11 produces the first and second verification logics 56 and 57 and executes logic simulation of the upper-hierarchy logic 52 using the first and second verification logics 56 and 57 and a test bench 58, which describes test pattern data. That is, the logic simulator 11 supplies input signal values to the input terminals 56a of the to-be-verified logic 56 of the uppermost hierarchy via the test bench 58 and compares output signal values, which are output from the output terminals 56d of the to-be-verified logic 56 according to the input signal values, with the expected values. Further, the logic simulator 11 supplies input signal values to the input terminals 56c of the to-be-verified logic 56 of the uppermost hierarchy via the test bench 58 and compares output signal values, which are output from the output terminals 56b of the to-be-verified logic 56 according to the input signal values, with the expected values. Based on the comparison results, the logic simulator 11 determines whether the logic operation of the upper-hierarchy logic 52 (logics 54 and 55) is normal or not.

The logic simulator 11 according to the first embodiment has the following advantages.

(1) At the time of executing simulation of the upper-hierarchy logic 22 for the system LSI 21, the logic simulator 11 produces the first and second verification logics 25 and 26 which describe logics for the input/output terminals that show the connection relationship between the upper-hierarchy logic 22 and the lower-hierarchy logic 23. The first and second verification logics 25 and 26 eliminate the need for those logics of the lower-hierarchy logic 23 which exclude the input terminals 23a and output terminals 23b at the time the logic simulator 11 performs operational verification of the upper-hierarchy logic 22. Therefore, in the verification of the upper-hierarchy logic 22, the lower-hierarchy logic 23 which is outside of the verification target is not verified. As a result, the execution time for the logic simulation is shortened and the logic verification is performed efficiently.

(2) At the time of verifying the upper-hierarchy logic 22, the first verification logic 25, which includes the upper-hierarchy logic 22 and the terminals 25a to 25d, and the second verification logic 26, which includes the terminals 23a and 23b, are stored in the memory 16 of the logic simulator 11. The amount of data of the first and second verification logics 25 and 26 is significantly smaller than the amount of data of the lower-hierarchy logic 23. This reduces the amount of space occupied in the memory at the time the logic simulation is executed. This prevents the execution speed of the logic simulation from slowing down and a reduction in verification efficiency.

(3) The first verification logic 25 includes logic data which describes the input terminals 25c equivalent to the output terminals 23b of the lower-hierarchy logic 23. The signal values, which are output from the lower-hierarchy logic 23, are adequately determined by the input signal values that are supplied to the input terminals 25c of the first verification logic 25.

(4) The first verification logic 25 includes logic data, which describes the input terminals 25a equivalent to the input terminals 22a of the upper-hierarchy logic 22, and logic data which describes the output terminals 25b equivalent to the output terminals 22b. This can allow for the use of existing simulation environments, such as the test bench 27, at the time of executing the logic simulation, to prevent an increase in the number of processing steps at the time of logic verification.

A logic verification method according to a second embodiment of the present invention will be described below referring to FIGS. 10 and 11.

Figure 10:
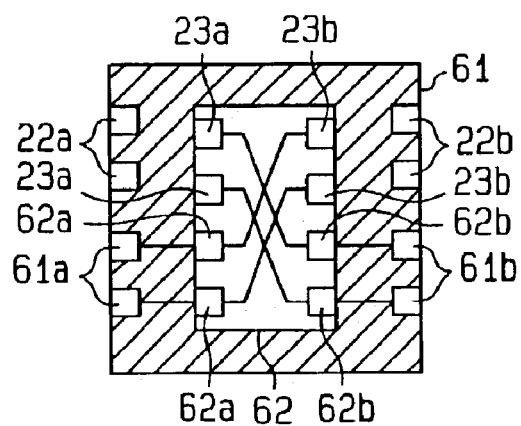
FIG. 10 shows a logic structure in a logic verification method according to a second embodiment of the present invention.

According to the second embodiment, as shown in FIG. 10, the logic simulator 11 produces a verification upper-hierarchy logic 61 by changing a part of the upper-hierarchy logic 22 and produces a verification logic 62 for the same hierarchy as the lower-hierarchy logic 23.

The verification upper-hierarchy logic 61 is logic data prepared by adding new descriptions of input terminals 61a and output terminals 61b to the upper-hierarchy logic 22.

The verification logic 62 is logic data which describes only those terminals that are connected to the verification upper-hierarchy logic 61. That is, the verification logic 62 is logic data including descriptions of the input terminals 23a and output terminals 23b of the lower-hierarchy logic 23 and newly added descriptions of input terminals 62a and output terminals 62b. The verification logic 62 is produced by deleting those logics of the lower-hierarchy logic 23 which exclude the input terminals 23a and output terminals 23b and adding the output terminals 62b, which are equivalent to the input terminals 23a of the lower-hierarchy logic 23, and the input terminals 62a, which are equivalent to the output terminals 23b of the lower-hierarchy logic 23, to the lower-hierarchy logic 23 that has undergone the deletion process. The input terminals 61a of the verification upper-hierarchy logic 61 are equivalent to the input terminals 62a of the verification logic 62. Further, the output terminals 61b of the verification upper-hierarchy logic 61 are equivalent to the output terminals 62b of the verification logic 62.

Figure 11:
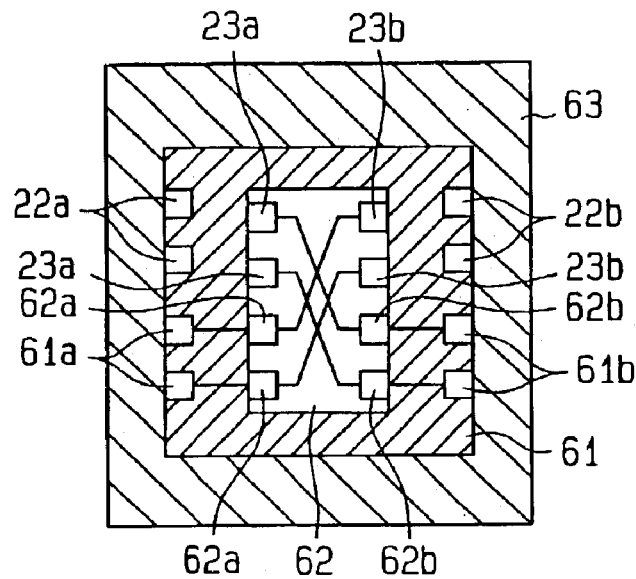
FIG. 11 is a conceptual diagram of logic simulation using the logic structure of FIG. 10.

FIG. 11 is a diagram for explaining logic simulation using the net list of FIG. 10. The logic simulator 11 produces the verification upper-hierarchy logic 61 and the verification logic 62 with respect to the upper-hierarchy logic 22 to be verified and executes logic simulation using a test bench 63, which describes test pattern data, the verification upper-hierarchy logic 61, and the verification upper-hierarchy logic 62. At this time, the logic simulator 11 supplies input signal values to the input terminals 22a of the verification upper-hierarchy logic 61 via the test bench 63 and compares the output signal values, which are output from the output terminals 61b of the verification upper-hierarchy logic 61 according to the input signal values, with the expected values. Further, the logic simulator 11 supplies input signal values to the input terminals 61a of the verification upper-hierarchy logic 61 via the test bench 63 and compares output signal values, which are output from the output terminals 22b of the verification upper-hierarchy logic 61 according to the input signal values, with the expected values.

Apparently, the logic verification method according to the second embodiment performs logic verification using existing simulation environments. In addition, this method minimizes the amount of logics stored in the memory 16 of the logic simulator 11 at the time of executing simulation.

Figure 12:
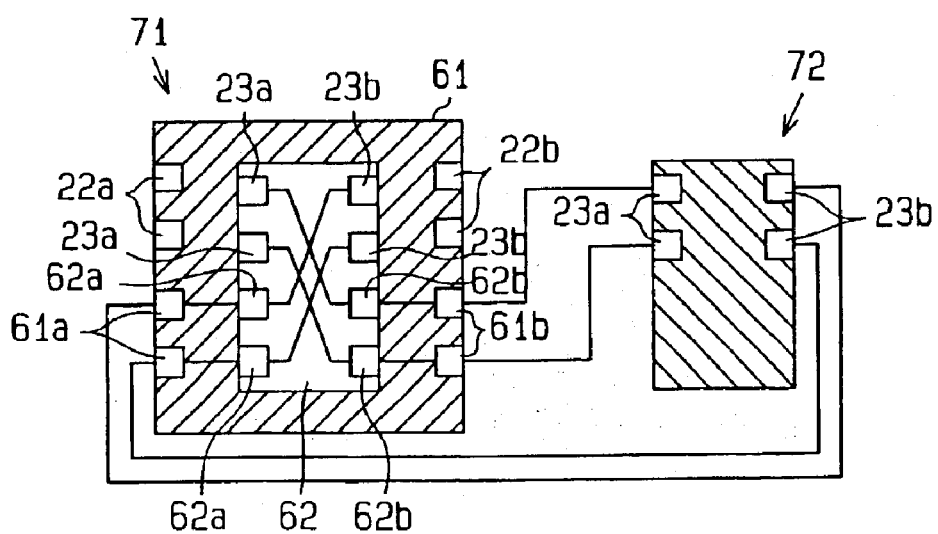
FIG. 12 shows a logic structure in a logic verification method according to a third embodiment of the present invention.

A logic verification method according to a third embodiment of the present invention will be described below referring to FIG. 12.

According to the third embodiment, the upper-hierarchy logic 22 (verification upper-hierarchy logic 61) is verified using LSIs 71 and 72. The LSI 71 has the function of hierarchical logics including the verification upper-hierarchy logic 61 and the verification logic 62. The LSI 72 has the function of the lower-hierarchy logic 23 of FIG. 2. The LSIs 71 and 72 are prepared by a programmable semiconductor device (e.g., field programmable gate array (FPGA)).

LSI 71 and 72 each are mounted on an unillustrated substrate. The input terminals 61a of the LSI 71 are connected to the output terminals 23b of the LSI 72 (lower-hierarchy logic 23), and the output terminals 61b of the LSI 71 are connected to the input terminals 23a of the LSI 72. When the logic simulator 11 supplies test signals having predetermined input signal values to the input terminals 22a of the LSI 71, output signal values according to the input signal values are supplied to the input terminals 23a of the LSI 72 from the output terminals 61b of the verification upper-hierarchy logic 61. Then, the input signal values are supplied to the input terminals 61a of the verification upper-hierarchy logic 61 from the output terminals 23b of the LSI 72, and the logic simulator 11 compares output signal values, which are output from the output terminals 22b of the verification upper-hierarchy logic 61 according to the input signal values, with the expected values. Verification of the upper-hierarchy logic 22 of the system LSI including the LSIs 71 and 72 is performed in this manner. In a case where the upper-hierarchy logic 22 is verified using the LSIs 71 and 72 which actually operate, operational verification is performed in the state where the lower-hierarchy logic 23 is actually built in the upper-hierarchy logic 22. This ensures operational verification with a higher precision.

It should be apparent to those skilled in the art that the present invention may be embodied in many other specific forms without departing from the spirit or scope of the invention. Particularly, it should be understood that the invention may be embodied in the following forms.

Logic verification of the upper-hierarchy of the first verification logic 25 may be performed using the first and second verification logics 25 and 26 that are produced in the first embodiment. Further, logic verification of the upper-hierarchy of the upper-hierarchy logic 22 (verification upper-hierarchy logic 61) may be executed using the verification logic 62 in the second embodiment.

If the lower-hierarchy logic 23, which is not the verification target, does not exist yet in the design stage of the system LSI 21, operational verification of the upper-hierarchy logic 22 may be executed as long as there are logics for the input terminals 23a and the output terminals 23b of the lower-hierarchy logic 23.

Although operational verification of the upper-hierarchy logic 22 is performed using the LSIs 71 and 72 which have the logic functions of the second embodiment in the third embodiment, the invention is not limited to this particular case. An LSI having the functions of the logics of the first embodiment (FIG. 3) and an LSI having the functions of the lower-hierarchy logic 23 may be prepared so that operational verification of the upper-hierarchy logic 22 is performed by connecting those two LSIs to each other.

Therefore, the present examples and embodiments are to be considered as illustrative and not restrictive and the invention is not to be limited to the details given herein, but may be modified within the scope and equivalence of the appended claims.

What is claimed is:

1. In designing a semiconductor device, a method of verifying an upper-hierarchy logic including at least one lower-hierarchy logic, which includes a lower-hierarchy input terminal and a lower-hierarchy output terminal, the method comprising the steps of:

producing a first verification logic having a first output terminal, which is equivalent to the lower-hierarchy input terminal of the lower-hierarchy logic, and a first input terminal, which is equivalent to the lower-hierarchy output terminal of the lower-hierarchy logic;

producing a second verification logic including only the lower-hierarchy input terminal and the lower-hierarchy output terminal of the lower-hierarchy logic; and executing an operational verification of the upper-hierarchy logic using the first and second verification logics.

2. The method according to claim 1, wherein the upper-hierarchy logic includes an upper-hierarchy input terminal and an upper-hierarchy output terminal, and the step of producing the first verification logic includes producing the first verification logic which includes the first input terminal, the first output terminal, a second input terminal, which is equivalent to the upper-hierarchy input terminal, and a second output terminal, which is equivalent to the upper-hierarchy output terminal.

3. The method according to claim 1, wherein the first verification logic is higher in hierarchy than the upper-hierarchy logic.

4. The method according to claim 1, wherein the step of executing the operational verification of the upper-hierarchy logic includes supplying a signal value substantially identical to another signal value, which is output from the lower-hierarchy output terminal, to the first input terminal of the first verification logic.

5. The method according to claim 1, further comprising the step of preparing a first semiconductor device, which includes functions of the upper-hierarchy logic and the first and second verification logics, and a second semiconductor device, which includes a function of the lower-hierarchy logic, using a programmable semiconductor device, and wherein the step of executing the operational verification of the upper-hierarchy logic includes executing the operational verification of the upper-hierarchy logic using the first and second semiconductor devices.

6. The method according to claim 1, further comprising the step of preparing a test bench which defines an input signal value to be supplied to the upper-hierarchy logic and an expected value to be output from the upper-hierarchy logic in accordance with the input signal value, and wherein the step of executing the operational verification of the upper-hierarchy logic includes executing the operational verification using the first and second verification logics and the test bench.

7. In designing a semiconductor device, a method of verifying an upper-hierarchy logic including at least one lower-hierarchy logic, which includes a lower-hierarchy input terminal and a lower-hierarchy output terminal, the method comprising the steps of:

deleting a logic excluding the lower-hierarchy input terminal and the lower-hierarchy output terminal from the lower-hierarchy logic;

producing a verification logic by adding a first output terminal, which is equivalent to the lower-hierarchy input terminal, and a first input terminal, which is equivalent to the lower-hierarchy output terminal, to the lower-hierarchy logic having undergone said step of deleting; and executing an operational verification of the upper-hierarchy logic using the verification logic.

8. The method according to claim 7, further comprising the step of adding a second output terminal, which is equivalent to the first output terminal, and a second input terminal, which is equivalent to the first input terminal, to the upper-hierarchy logic.

9. The method according to claim 7, wherein the verification logic is produced at a same hierarchy as the lower-hierarchy logic.

10. The method according to claim 7, wherein the step of executing the operational verification of the upper-hierarchy logic includes supplying a signal value, which is substantially identical to another signal value output from the lower-hierarchy output terminal, to the first input terminal of the verification logic.

11. The method according to claim 7, further comprising the step of preparing a first semiconductor device, which includes functions of the upper-hierarchy logic and the verification logic, and a second semiconductor device, which includes a function of the lower-hierarchy logic, using a programmable semiconductor device, and wherein the step of executing the operational verification of the upper-hierarchy logic includes executing the operational verification of the upper-hierarchy logic using the first and second semiconductor devices.

12. The method according to claim 7, further comprising the step of preparing a test bench which defines an input signal value to be supplied to the upper-hierarchy logic and an expected value to be output from the upper-hierarchy logic in accordance with the input signal value, and wherein the step of executing the operational verification of the upper-hierarchy logic includes executing the operational verification using the verification logic and the test bench.

13. In designing a semiconductor device, a computer readable program for verifying an upper-hierarchy logic including at least one lower-hierarchy logic, which includes a lower-hierarchy input terminal and a lower-hierarchy output terminal, the program causing the computer to execute a method comprising the steps of:

producing a first verification logic having a first output terminal, which is equivalent to the lower-hierarchy input terminal of the lower-hierarchy logic, and a first input terminal, which is equivalent to the lower-hierarchy output terminal of the lower-hierarchy logic;

producing a second verification logic including only the lower-hierarchy input terminal and the lower-hierarchy output terminal of the lower-hierarchy logic; and executing an operational verification of the upper-hierarchy logic using the first and second verification logics.

14. In designing a semiconductor device, a computer readable program for verifying an upper-hierarchy logic including at least one lower-hierarchy logic, which includes a lower-hierarchy input terminal and a lower-hierarchy output terminal, the program causing the computer to execute a method comprising the steps of:

deleting a logic excluding the lower-hierarchy input terminal and the lower-hierarchy output terminal from the lower-hierarchy logic;

producing a verification logic by adding a first output terminal, which is equivalent to the lower-hierarchy input terminal, and a first input terminal, which is equivalent to the lower-hierarchy output terminal, to the lower-hierarchy logic having undergone the step of deleting; and executing an operational verification of the upper-hierarchy logic using the verification logic.

15. An apparatus for verifying an upper-hierarchy logic including at least one lower-hierarchy logic, which includes a lower-hierarchy input terminal and a lower-hierarchy output terminal, the apparatus comprising:

a processing unit for producing a first verification logic having a first output terminal, which is equivalent to the lower-hierarchy input terminal of the lower-hierarchy logic, and a first input terminal, which is equivalent to the lower-hierarchy output terminal of the lower-hierarchy logic, wherein the processing unit produces a second verification logic including only the lower-hierarchy input terminal and the lower-hierarchy output terminal of the lower-hierarchy logic; and a memory coupled to the processing unit for storing the first and second verification logics, wherein the processing unit executes an operational verification of the upper-hierarchy logic using the first and second verification logics stored in the memory.

16. An apparatus for verifying an upper-hierarchy logic including at least one lower-hierarchy logic, which includes a lower-hierarchy input terminal and a lower-hierarchy output terminal, the apparatus comprising:

a processing unit for deleting a logic excluding the lower-hierarchy input terminal and the lower-hierarchy output terminal from the lower-hierarchy logic, wherein the processing unit produces a verification logic by adding a first output terminal, which is equivalent to the lower-hierarchy input terminal, and a first input terminal, which is equivalent to the lower-hierarchy output terminal, to the lower-hierarchy logic having undergone the deleting; and a memory coupled to the processing unit for storing the verification logic, wherein the processing unit executes an operational verification of the upper-hierarchy logic using the verification logic stored in the memory.

* * * * *